United States Patent
Dai et al.

(10) Patent No.: US 8,105,753 B2
(45) Date of Patent: Jan. 31, 2012

(54) SYSTEM, METHOD AND APPARATUS FOR PATTERN CLEAN-UP DURING FABRICATION OF PATTERNED MEDIA USING FORCED ASSEMBLY OF MOLECULES

(75) Inventors: Qing Dai, San Jose, CA (US); Dan Saylor Kercher, Santa Cruz, CA (US); Huey-Ming Tzeng, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1098 days.

(21) Appl. No.: 11/946,423

(22) Filed: Nov. 28, 2007

(65) Prior Publication Data
US 2009/0136873 A1    May 28, 2009

(51) Int. Cl.
*G03F 7/20* (2006.01)
(52) U.S. Cl. ........ 430/296; 430/320; 430/323; 430/324; 216/22
(58) Field of Classification Search ........................ None
See application file for complete search history.

(56) References Cited

U.S. PATENT DOCUMENTS

| | | |
|---|---|---|
| 4,728,591 A | 3/1988 | Clark et al. |
| 6,329,070 B1 | 12/2001 | Sass et al. |
| 6,518,194 B2 | 2/2003 | Winningham et al. |
| 6,656,568 B1 | 12/2003 | Winningham et al. |
| 6,673,401 B2 | 1/2004 | Black et al. |
| 7,037,728 B2 | 5/2006 | Yamashita |
| 2003/0068446 A1 | 4/2003 | Mirkin et al. |
| 2005/0130258 A1 | 6/2005 | Trent et al. |
| 2005/0266271 A1* | 12/2005 | Tsuchiya et al. ............. 428/810 |
| 2006/0027799 A1 | 2/2006 | Kobayashi et al. |
| 2006/0084792 A1 | 4/2006 | Paavola et al. |
| 2007/0116989 A1* | 5/2007 | Ikekame et al. ........... 428/828.1 |
| 2009/0114618 A1* | 5/2009 | Zhang et al. .................... 216/42 |

OTHER PUBLICATIONS

Douglas, Kenneth, et al., Nanometer Molecular Lithography, American Institute of Physics, Jan. 1986, pp. 676-678, Appl. Phys. Lett. vol. 48, No. 10.
McMillan, R. Andrew, et al., Ordered Nanoparticle Arrays Formed on Engineered Chaperonin Protein Templates, Nature Materials, Dec. 2002, vol. 1, pp. 247-252, www.nature.com/naturematerials.
Kim, Sang Ouk, et al., Epitaxial Self-Assembly of Block Copolymers on Lithographically Defined Nanopatterned Substrates, Nature Publishing Group, Jul. 2003, vol. 424, pp. 411-414, www.nature.com/nature.
Guo, D., et al., A Protein Patterning Technique and Its Application in Bio-Inspired Self-Assembly, Materials Research Society, 2003, Mat. Res. Soc. Symp. Proc. vol. 735, pp. C2.4.1-C2.4.6.

(Continued)

*Primary Examiner* — John A. McPherson

(57) ABSTRACT

A pattern clean-up for fabrication of patterned media using a forced assembly of molecules is disclosed. E-beam lithography is initially used to write the initial patterned bit media structures, which have size and positioning errors. Nano-sized protein molecules are then forced to assemble of on top of the bits. The protein molecules have a very uniform size distribution and assemble into a lattice structure above the e-beam patterned areas. The protein molecules reduce the size and position errors in e-beam patterned structures. This process cleans the signal from the e-beam lithography and lowers the noise in the magnetic reading and writing. This process may be used to fabricate patterned bit media directly on hard disk, or to create a nano-imprint master for mass production of patterned bit media disks.

25 Claims, 5 Drawing Sheets

OTHER PUBLICATIONS

Hoinville, Jay, et al., High Density Magnetic Recording on Protein-Derived Nanoparticles, Journal of Applied Physics, May 2003, vol. 93, No. 10, pp. 7187-7189.

Sarikaya, Mehmet, et al., Molecular Biomimetics: Nanotechnology Through Biology, Nature Publishing Group, Sep. 2003, vol. 2, pp. 577-585, www.nature.com/naturematerials.com.

Lan, Sheeny, et al., Surface Modification of Silicon and Gold-Patterned Silicon Surfaces for Improved Biocompatibility and Cell Patterning Selectivity, Jul. 2004, Elsevier VB, Biosensors & Bioelectronics, 20 1697-1708.

Xiong, Xiaorong, et al., Nanoscale Self-Assembly Mediated by Genetically Engineered Gold-Binding Polypeptide, IEEE, Jul. 2005, Japan.

Futaba, et al., Shape-Engineerable and Highly Densely Packed Single-Walled Carbon Nanotubes and Their Application as Super-Capacitor Electrodes, Nature Publishing Group, Dec. 2006, vol. 5, pp. 987-994.

Ramanajuan, C. S., et al., Self-Assembly of Vesicle Nanoarrays on Si: A Potential Route to High-Density Functional Protein Arrays, American Institute of Physics, 2007, 90, pp. 033901-1-033901-3.

\* cited by examiner

SYSTEM, METHOD AND APPARATUS FOR PATTERN CLEAN-UP DURING FABRICATION OF PATTERNED MEDIA USING FORCED ASSEMBLY OF MOLECULES

BACKGROUND OF THE INVENTION

1. Technical Field

The present invention relates in general to fabricating patterned media and, in particular, to an improved system, method, and apparatus for pattern clean-up during fabrication of patterned media using forced assembly of molecules.

2. Description of the Related Art

E-beam lithography can be used to form patterned bit media structures for hard disk drives. However, when the features being exposed by the e-beam lithography system approach the resolution of the lithography tool, typically there will be unacceptable variations in the size and positioning of the patterns created. These variations cause problems, such as noise, for magnetically reading and writing on patterned bit media structures.

For example, one ideal shape for a "lift-off" e-beam pattern is depicted in FIG. 1. In this process the resolution of the lithography tool is sufficient to form uniform dots 11 in a symmetrical array as shown. However, as illustrated in FIG. 2, features that are smaller than the resolution limit of the lithography tool form irregular shapes 21 that are non-symmetrically arrayed. Although these methods are workable for some applications, an improved solution for a system, method and apparatus for pattern clean-up during fabrication of even smaller patterned media would be desirable.

SUMMARY OF THE INVENTION

Embodiments of a system, method, and apparatus for pattern clean-up for fabrication of patterned media using a forced assembly of nano-sized particles is disclosed. The invention uses lithography to write the initial patterned bit media structures, which have size and positioning errors, and then forces the assembly of the nano-sized particles on top of these bits.

The nano-particles, such as protein molecules, have a very uniform size distribution and assemble into a lattice structure above the patterned areas. The protein molecules can be used to reduce the size and position errors in patterned structures. This process will "clean-up" the "dirty" signal from the lithography and, therefore, lower the noise in the magnetic reading and writing. This process may be used to fabricate patterned bit media directly on hard disk, or to make a nano-imprint master for mass production of patterned bit media disks.

In one embodiment, a pattern is first fabricated on a disk or imprint master using e-beam lithography and a "lift-off" metallization process. First, a positive e-beam resist is exposed and developed leaving small holes in the resist. A directional metallization process is then used to coat the sample with a noble metal. Finally, a solvent is used to "lift-off" the e-beam resist and leave behind the noble metal dots. Ideally, this process results in metal dots that are perfectly shaped and positioned. However, when the e-beam lithography tool used to fabricate the features is at or beyond the limits of its resolution, there is some error in shape and position of the dots. The imperfections can come from the e-beam dose, positioning errors, problems with the "lift-off" process, etc.

The nano-particles utilized by the invention can have size and shape distributions that are much more consistent than the spot size distributions created with e-beam lithography. The substrate patterned with e-beam lithography may be placed into a wet solution suspending the biological agent of choice. For example, the substrate may be placed into a solution containing chaperonin. At this stage, the chaperonin molecules bond to the gold dots on the substrate surface. In particular, the thiol group on the cystein protein near the opening of the chaperonin protein interacts with the gold to form a semi-covalent bond that is about half of the carbon-carbon bond strength.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the present invention, which will become apparent, are attained and can be understood in more detail, more particular description of the invention briefly summarized above may be had by reference to the embodiments thereof that are illustrated in the appended drawings which form a part of this specification. It is to be noted, however, that the drawings illustrate only some embodiments of the invention and therefore are not to be considered limiting of its scope as the invention may admit to other equally effective embodiments.

DETAILED DESCRIPTION OF THE INVENTION

Figure 1:
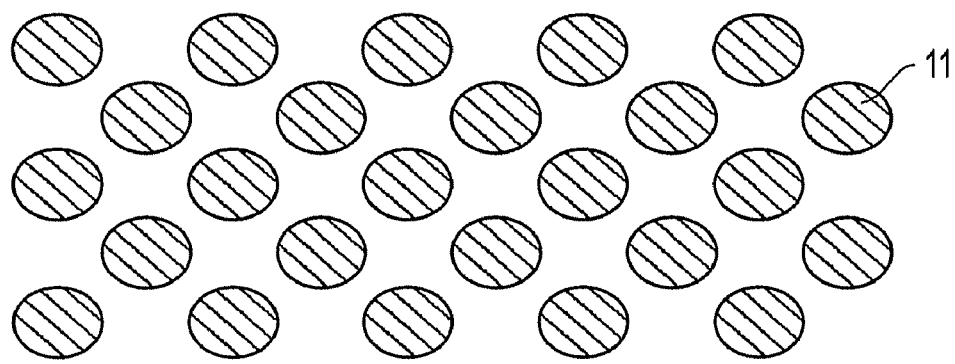
FIG. 1 depicts a conventional e-beam pattern having features that are within the resolution limits of a lithography tool.
Figure 2:
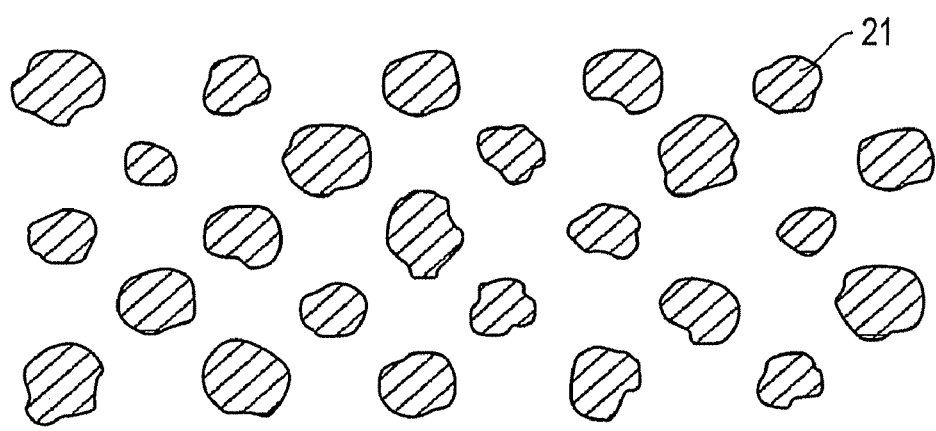
FIG. 2 depicts an e-beam pattern having features that are smaller than the resolution limits of a lithography tool.
Figure 3A:
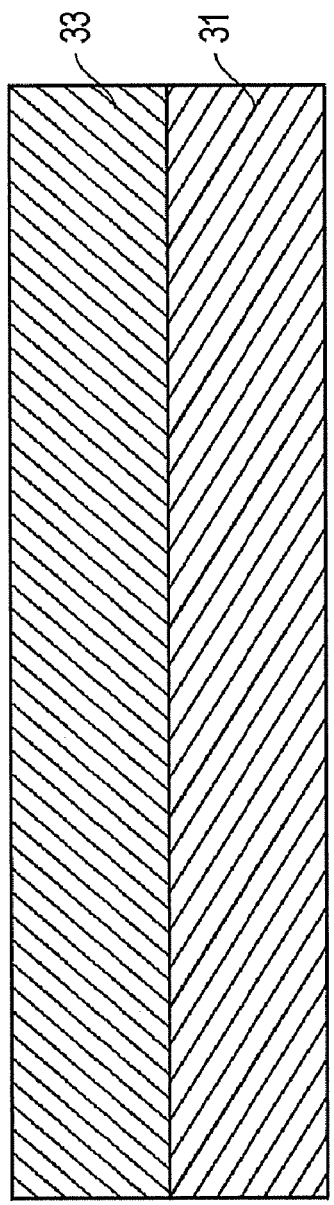
FIGS. 3A-G are schematic sectional side views of one embodiment of a method in accordance with the invention.
Figure 3B:
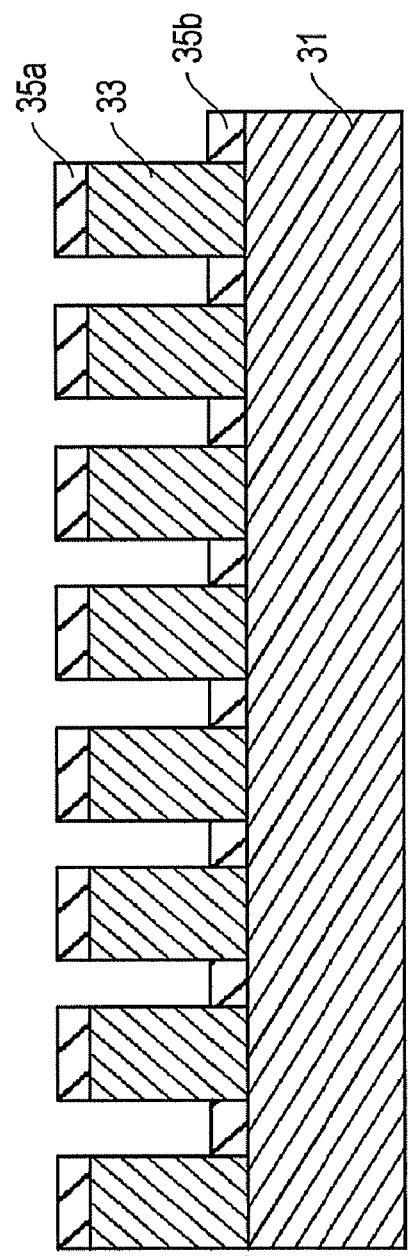
Figure 3C:
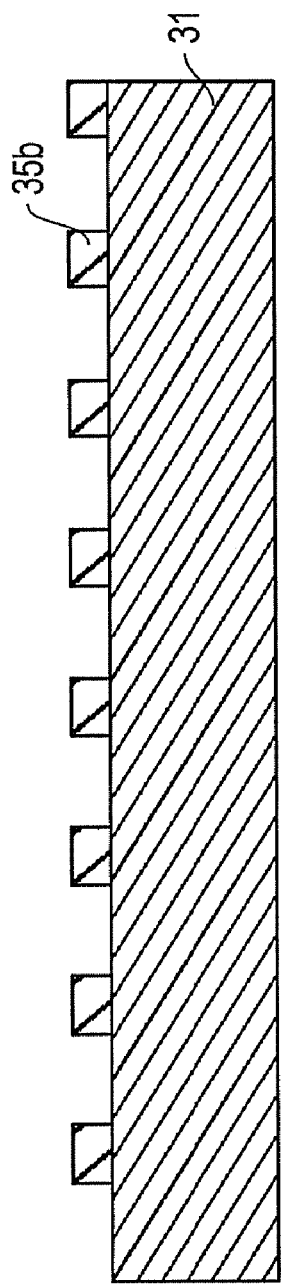
Figure 3D:
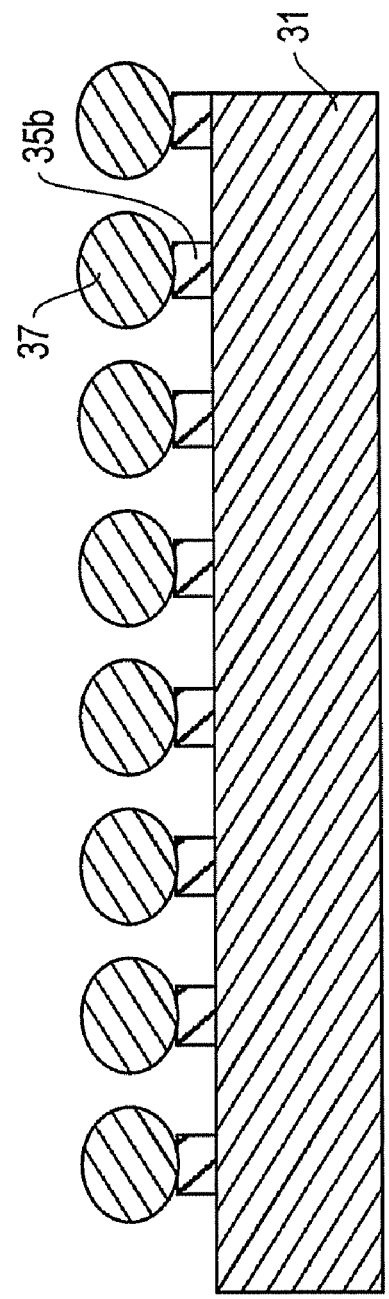
Figure 3E:
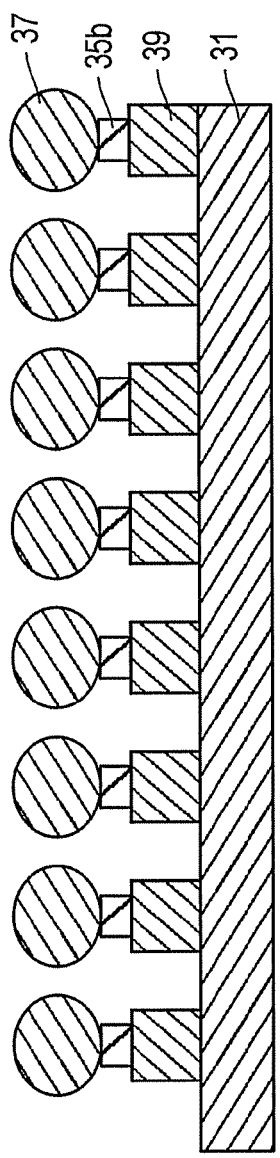
Figure 3F:
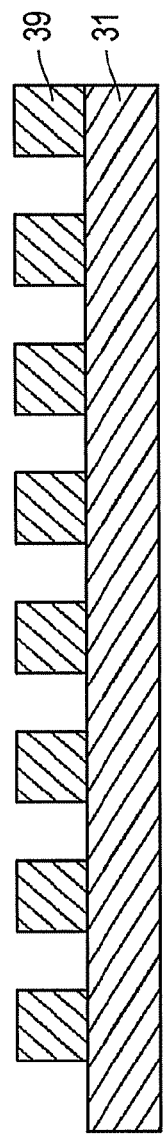
Figure 3G:
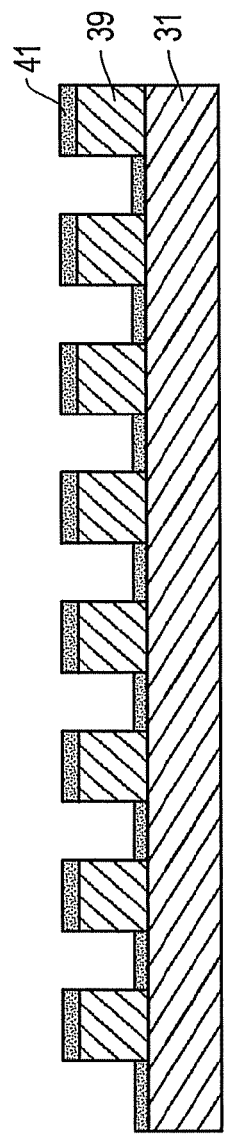
Figure 4:
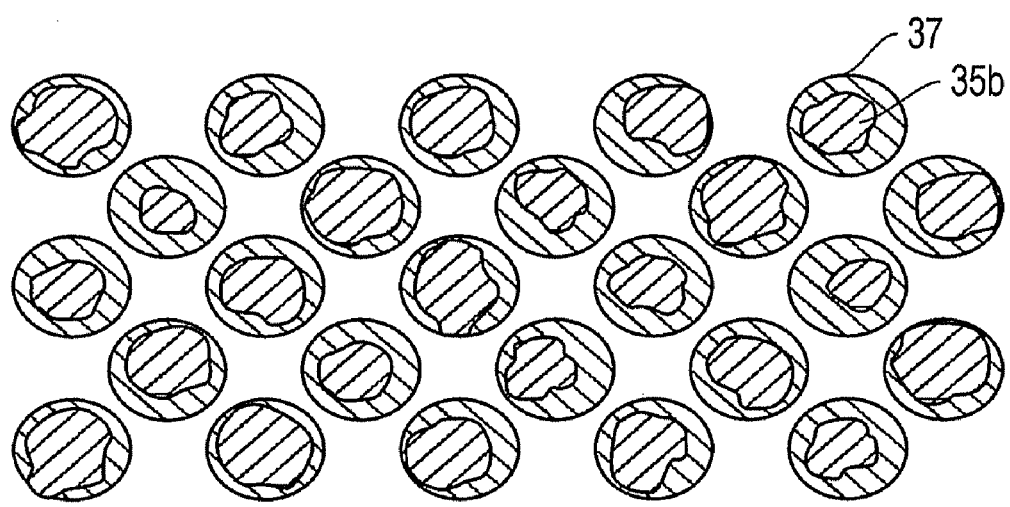
FIG. 4 is a schematic top view of the step illustrated in FIG. 3D and is constructed in accordance with the invention.

Referring to FIGS. 3 and 4, embodiments of a system, method and apparatus for fabricating patterned media are disclosed. The invention is well suited for pattern clean-up during fabrication of patterned media using a forced assembly of nano-sized particles. Advantageously, the patterned media may be used to directly form disks for disk drives, or form nano-imprint masters for mass production of patterned bit media disks.

As shown in FIG. 3A, a substrate 31 is provided with resist 33, such as an e-beam resist, optical resist or block co-polymers. The resist 33 is exposed and developed on the substrate 31 (see FIG. 3B) such that holes or other configurations are formed in the resist. A material 35 such as a metal (e.g., a noble metal like gold) is deposited on the developed the e-beam resist (see 35a) and on the substrate (see 35b) as shown. The noble metal may be directionally evaporated on the developed e-beam resist and substrate to form a coating thereon.

Referring now to FIG. 3C, the e-beam resist 33 and the noble metal 35a on the e-beam resist are removed from the substrate 31 such that noble metal features 35b remain on the substrate 31. This step may comprise a lift off metallization process using hot solvent to strip the e-beam resist and noble metal on the e-beam resist from the substrate such that noble metal features remain on the substrate. The features may be at or beyond a resolution of a lithography tool (e.g., e-beam) used to form the features such that the features have irregular shapes and are not symmetrically arrayed.

As shown in FIGS. 3D and 4, the invention further comprises attaching nano-sized particles such as molecules 37 to the noble metal features 35b. The molecules may comprise biological agents, such as protein molecules, or man-made particles that have a uniform size distribution. The molecules assemble into a lattice structure above the noble metal features such that the protein molecules reduce size and position errors in the patterned media that will ultimately be formed. In other embodiments, the molecules may be ultrasonically agitated and/or enzymes may be used to promote bonding to facilitate self-assembly onto the noble metal features.

In one embodiment, the molecules comprise chaperonin molecules that attach to each of the noble metal features. The protein molecule chaperonin is cylindrically shaped with a diameter of about 17 nm. Chaperonin may be created with a thiol functional group connected to it, which readily bonds to noble metals such as gold.

As shown in FIG. 3E, the substrate may be reactive ion etched (RIE) with fluorine plasma to facilitate self-assembly and an orderly, symmetrical array (see, e.g., FIG. 4) of the molecules onto the noble metal features. In other embodiments, the molecules may be ultrasonically agitated and/or enzymes may be used to promote bonding to facilitate self-assembly onto the noble metal features.

In another embodiment, the molecules are magnetic biological agents, and magnetic fields are used to facilitate self-assembly onto the noble metal features. In still another embodiment, a monolayer of alkanethiols is used to facilitate self-assembly of the molecules onto the noble metal features. The monolayer of alkanethiols may comprise a dithiols (e.g., Sigma-Aldrich 662615) having a thiol function head that forms disulfur bonds with a thiol group on a cystein protein near an opening of the chaperonin.

After the guided assembly of chaperonin molecules on to the surface of the substrate, other processes, such as dry etching can be used to transfer this highly organized and uniform pattern into the substrate. During the etching process the nano-particles act as a mask and protect the original substrate surface. The etching could be done with processes such as reactive ion etch (RIE), wet chemical etch, or ion beam etch. The etch process forms a topography on the substrate surface. For example, referring to FIGS. 3E and 3F, the method may further comprise removing the molecules 37 and the noble metal features 35b from the substrate 31 to form a topographically patterned substrate 39. This step may be performed with wet etching to form the patterned substrate and suspend the molecules. Finally, a magnetic media layer 41 is deposited (see FIG. 3G) on the patterned substrate 39 to form patterned media.

The invention has significant advantages over the prior art, including the ability to clean dirty signals from e-beam lithography and lower noise in magnetic reading and writing. The size and positioning errors formed when using e-beam lithography at its limit of resolution are overcome by forcing an assembly of nano-sized molecules to array on top of the formed bits. The process is quite versatile as it may be used to fabricate hard disks or to create nano-imprinted masters used in the production of hard disks.

While the invention has been shown or described in only some of its forms, it should be apparent to those skilled in the art that it is not so limited, but is susceptible to various changes without departing from the scope of the invention.

What is claimed is:

1. A method of fabricating patterned media, comprising:
   (a) providing a substrate with resist;
   (b) exposing and developing the resist on the substrate;
   (c) depositing a metal on the developed resist and substrate;
   (d) removing the resist and metal on the resist from the substrate such that metal features remain on the substrate;
   (e) attaching nano-sized particles to the metal features;
   (f) using the nano-sized particles as a mask to protect selected portions of the substrate while exposed portions of the substrate are etched;
   (g) removing the nano-sized particles and the metal features from the etched substrate to form a topographically patterned substrate; and
   (h) depositing a magnetic media layer on the topographically patterned substrate to form patterned media.

2. A method according to claim 1, wherein the patterned media is a disk for a disk drive, or a nano-imprint master for mass production of patterned bit media disks.

3. A method according to claim 1, wherein step (b) comprises forming holes in the resist, and step (c) comprises directionally evaporating gold on the developed resist and substrate to form a coating thereon.

4. A method according to claim 1, wherein step (d) comprises a lift off metallization process using hot solvent to strip the resist and metal on the resist from the substrate such that the metal features remain on the substrate, the metal features being at or beyond a resolution of a lithography tool used to form the metal features such that the metal features have irregular shapes and are not symmetrically arrayed.

5. A method according to claim 1, wherein the nano-sized particles are protein molecules having a uniform size distribution that assemble into a lattice structure above the metal features in step (e), such that the protein molecules reduce size and position errors in the patterned media.

6. A method according to claim 1, wherein step (e) comprises attaching a chaperonin molecule to each of the metal features, and step (f) comprises reactive ion etching (RIE) the substrate with fluorine plasma.

7. A method according to claim 1, further comprising removing the nano-sized particles and the metal features from the substrate with wet etching to form the topographically patterned substrate to suspend non-sized particles.

8. A method according to claim 1, wherein step (e) further comprises ultrasonically agitating the nano-sized particles to facilitate self-assembly onto the metal features.

9. A method according to claim 1, wherein step (e) further comprises using enzymes to promote the bonding of the nano-sized particles to the metal features.

10. A method according to claim 1, wherein the nano-sized particles are magnetic biological agents, and step (e) comprises using magnetic fields to facilitate self-assembly onto the metal features.

11. A method according to claim 1, wherein step (e) comprises using a monolayer of alkanethiols to facilitate self-assembly of the nano-sized particles onto the metal features.

12. A method according to claim 11, wherein nano-sized particles comprise chaperonin, and the monolayer of alkanethiols comprises a dithiols having a thiol function head that forms disulfur bonds with a thiol group on a cystein protein near an opening of the chaperonin.

13. A method of fabricating patterned media, comprising:
   (a) providing a substrate with e-beam resist;
   (b) exposing and developing the e-beam resist on the substrate;
   (c) depositing a noble metal on the developed e-beam resist and substrate;
   (d) removing the e-beam resist and noble metal on the e-beam resist from the substrate such that noble metal features remain on the substrate;
   (e) attaching molecules to the noble metal features;

(f) using the molecules as a mask to protect selected portions of the substrate while exposed portions of the substrate are etched;

(g) removing the molecules and the noble metal features from the etched substrate to form a topographically patterned substrate; and (h) depositing a magnetic media layer on the topographically patterned substrate to form patterned media.

14. A method according to claim 13, wherein the patterned media is one of a disk for a disk drive, and a nano-imprint master for mass production of patterned bit media disks.

15. A method according to claim 13, wherein step (b) comprises forming holes in the resist, and step (c) comprises directionally evaporating gold on the developed e-beam resist and substrate to form a coating thereon.

16. A method according to claim 13, wherein step (d) comprises a lift off metallization process using hot solvent to strip the e-beam resist and noble metal on the e-beam resist from the substrate such that noble metal features remain on the substrate, the features being at or beyond a resolution of an e-beam lithography tool used to form the features such that the features have irregular shapes and are not symmetrically arrayed.

17. A method according to claim 13, wherein the molecules are protein molecules having a uniform size distribution that assemble into a lattice structure above the noble metal features in step (e), such that the protein molecules reduce size and position errors in the patterned media.

18. A method according to claim 13, wherein step (e) comprises attaching a chaperonin molecule to each of the noble metal features, and step (f) comprises reactive ion etching (RIE) the substrate with fluorine plasma.

19. A method according to claim 13, further comprising removing the molecules and the noble metal features from the substrate with wet etching to form the topographically patterned substrate to suspend molecules.

20. A method according to claim 13, wherein step (e) further comprises ultrasonically agitating the molecules to facilitate self-assembly onto the noble metal features.

21. A method according to claim 13, wherein step (e) further comprises using enzymes to promote the bonding of the molecules to the noble metal features.

22. A method according to claim 13, wherein the molecules are magnetic biological agents, and step (e) comprises using magnetic fields to facilitate self-assembly onto the noble metal features.

23. A method according to claim 13, wherein step (e) comprises using a monolayer of alkanethiols to facilitate self-assembly of the molecules onto the noble metal features.

24. A method according to claim 23, wherein molecules comprise chaperonin, and the monolayer of alkanethiols comprises a dithiols having a thiol function head that forms disulfur bonds with a thiol group on a cystein protein near an opening of the chaperonin.

25. A method of forming a hard disk drive, comprising:
(a) providing a substrate with e-beam resist;
(b) exposing and developing the e-beam resist on the substrate;
(c) depositing a noble metal on the developed e-beam resist and substrate;
(d) removing the e-beam resist and noble metal on the e-beam resist from the substrate such that noble metal features remain on the substrate;
(e) attaching molecules to the noble metal features;
(f) using the molecules as a mask to protect selected portions of the substrate while exposed portions of the substrate are etched;
(g) removing the molecules and the noble metal features from the etched substrate to form a topographically patterned substrate;
(h) depositing a magnetic media layer on the topographically patterned substrate to form patterned media on a magnetic media disk; and
(i) making a hard disk drive with the magnetic media disk.

* * * * *